(12) United States Patent
Zama et al.

(10) Patent No.: US 8,183,153 B2
(45) Date of Patent: May 22, 2012

(54) METHOD FOR MANUFACTURING SEMICONDUCTOR DEVICE

(75) Inventors: Hideaki Zama, Susono (JP); Michio Ishikawa, Susono (JP); Takumi Kadota, Ube (JP); Chihiro Hasegawa, Ube (JP)

(73) Assignee: Ulvac, Inc., Kanagawa (JP)

( * ) Notice: Subject to any disclaimer, the term of this patent is extended or adjusted under 35 U.S.C. 154(b) by 119 days.

(21) Appl. No.: 12/676,322

(22) PCT Filed: Sep. 3, 2008

(86) PCT No.: PCT/JP2008/065870
§ 371 (c)(1),
(2), (4) Date: Aug. 25, 2010

(87) PCT Pub. No.: WO2009/031582
PCT Pub. Date: Mar. 12, 2009

(65) Prior Publication Data
US 2010/0317189 A1    Dec. 16, 2010

(30) Foreign Application Priority Data
Sep. 3, 2007    (JP) .................................. 2007-228059

(51) Int. Cl.
*H01L 21/4763* (2006.01)
(52) U.S. Cl. ........ 438/644; 438/637; 438/643; 427/252; 427/255.7
(58) Field of Classification Search .......... 438/637–644; 427/252, 255.7
See application file for complete search history.

(56) References Cited

U.S. PATENT DOCUMENTS

| | | | | |
|---|---|---|---|---|
| 6,099,903 A | * | 8/2000 | Kaloyeros et al. | 427/250 |
| 6,184,403 B1 | * | 2/2001 | Welch et al. | 556/12 |
| 6,340,768 B1 | * | 1/2002 | Welch et al. | 556/12 |
| 6,359,159 B1 | * | 3/2002 | Welch et al. | 556/12 |
| 6,484,403 B1 | * | 11/2002 | Macklin et al. | 29/898.01 |

FOREIGN PATENT DOCUMENTS

| | | |
|---|---|---|
| JP | 10-229084 | 8/1998 |
| JP | 2005-012138 | 1/2005 |
| JP | 2005-129745 | 5/2005 |
| JP | 2006-328526 | 12/2006 |

OTHER PUBLICATIONS

AMP Netconnect "2000 Product Catalog"; Tyco Electronics Corporaton, p. 2.27; 2000.

* cited by examiner

*Primary Examiner* — Jenny L Wagner
(74) *Attorney, Agent, or Firm* — Patterson Thuente Christensen Pedersen, P.A.

(57) ABSTRACT

Disclosed is a method for manufacturing a semiconductor device which is decreased in resistance of a copper wiring containing a ruthenium-containing film and a copper-containing film, thereby having improved reliability. Also disclosed is an apparatus for manufacturing a semiconductor device. Specifically, an Ru film is formed on a substrate having a recessed portion by a CVD method using a raw material containing an organic ruthenium complex represented by the general formula and a reducing gas (step S12). Then, a Cu film is formed on the Ru film by a CVD method using a raw material containing an organic copper complex represented by the general formula and a reducing gas, thereby forming a copper wiring containing the Ru film and the Cu film in the recessed portion (step S14).

24 Claims, 5 Drawing Sheets

METHOD FOR MANUFACTURING SEMICONDUCTOR DEVICE

TECHNICAL FIELD

The present invention relates to a method for manufacturing a semiconductor device.

BACKGROUND ART

The progress in miniaturization and multi-layering of semiconductor devices has increased current density, which has resulted in serious electromigration (EM). Multilayer wiring techniques using copper wires, which have a high EM resistance, is thus essential for higher integration of semiconductor devices.

In a multilayer wiring technique for semiconductor devices, to improve the productivity and reliability of metal wiring, various underlayers having various types of functions are normally arranged between an insulative layer and the metal wiring. As such an underlayer, for example, a barrier layer for preventing the diffusion of metal atoms, an adhesion layer for adhering the metal wiring and the insulative layer, and a seed layer for enhancing film growth of a wiring material are known.

When using aluminum or tungsten as the wiring material, metal material such as tantalum, titanium, tantalum nitride, and titanium nitride are used as the material of the underlayer. In a multilayer wiring technique using copper wires, these metal materials are not effective for use as the material for the underlayer. This is because when a low-permittivity film is used as the insulative layer, the application of these materials to the underlayer would diffuse the moisture and oxygen contained in the insulative layer and easily oxidizes the metal contained in the underlayer. This increases the resistance of the underlayer, weakens the adhesion effect, and seriously lowers the reliability of the semiconductor device.

To resolve these problems, various types of materials for the underlayer that is applicable to a multilayer wiring technique using copper wires have been presented. Patent document 1 and patent document 2 disclose the use of a ruthenium (Ru) film or a multilayer film including an Ru film as the underlayer for copper wires. Since ruthenium oxide is conductive, the use of the Ru film prevents the resistance from increasing in the underlayer and suppresses oxidation of the copper wiring. Further, by superimposing the adhesion layer on the Ru film, the adhesion between the Ru film and the copper wires may be further improved.

Patent Document 1: Japanese Laid-Open Patent Publication No. 2005-129745
Patent Document 2: Japanese Laid-Open Patent Publication No. 2006-328526

DISCLOSURE OF THE INVENTION

Processes for manufacturing copper wires may include a so-called Damascene process and a Dual-Damascene process. Specifically, trenches are formed beforehand in an insulative layer in accordance with a wiring pattern, an underlayer is superimposed on the inner surfaces of the trenches, and then a copper material is buried in the trenches to form copper wires. Alternatively, trenches and via-holes are formed beforehand in an insulative layer, an underlayer is superimposed on the inner surfaces of both trenches and via-holes, and then copper material is buried in the trenches and the via-holes to simultaneously form copper wires and via-plugs.

The underlayer (ruthenium film) is, however, formed by decomposing a raw material ruthenium complex by introducing oxygen gas. Wires in a layer below the copper wires are exposed to a film formation space of the ruthenium film. Thus, the formation of an underlayer film oxidizes the copper wires. As a result, the process for manufacturing copper wires significantly increases the resistance of the wiring structure including the copper wires. Thus, subsequent to formation, the ruthenium film must be exposed to a reducing gas atmosphere in order to lower the resistance of the copper wires.

The present invention provides a method for manufacturing a semiconductor device which has a multilayer structure including a ruthenium-containing film and a copper-containing film and which reduces the resistance of copper wires and improves the reliability of the semiconductor device.

One aspect of the present invention is a method for manufacturing a semiconductor device including a copper wire. The method includes forming a ruthenium-containing film on a subject in which a recess is formed by performing a CVD process using an organic ruthenium complex and a first reducing gas, and forming a copper-containing film on the ruthenium-containing film to bury a copper-containing film in the recess by performing a CVD process using an organic copper complex and a second reducing gas.

This method does not require oxygen, and enables the decomposition with the reducing gas. Thus, the ruthenium-containing film is formed without being oxidized. As a result, the resistance of the copper wire is decreased. Further, after the formation of the ruthenium-containing film, the reducing process is unnecessary. Thus, the process time may be shortened.

It is preferable that a ruthenium-containing film be formed on a subject in which a recess is formed by performing a CVD process using an organic ruthenium complex and a first reducing gas. In this case, oxygen is not required, and decomposition is performed with the reducing gas. Thus, the ruthenium-containing film is formed without being oxidized. As a result, the resistance of the copper wire is decreased. Further, after the formation of the ruthenium-containing film, the reducing process is unnecessary. Thus, the process time may be shortened.

The first reducing gas used in the forming a ruthenium-containing film may be at least one selected from a group consisting of hydrogen ($H_2$), ammonia ($NH_3$), hydrazine derivative, silane ($SiH_4$), and disilane ($Si_2H_6$).

The reducing effect of at least one selected from the group consisting of hydrogen, ammonia, hydrazine derivative, silane, and disilane decomposes the organic ruthenium complex. Thus, the ruthenium-containing film may be formed without being oxidized, and the resistance of the copper wire is decreased. Further, after the formation of the ruthenium-containing film, the reducing process is unnecessary. Thus, the process time may be shortened.

The hydrazine derivative used in the forming a ruthenium-containing film is substituted hydrazine that substitutes one or two hydrogen atoms of hydrazine with a group selected from a group consisting of a methyl group, an ethyl group, and a normal or branched butyl group.

The hydrazine derivative has a simple structure, is easy to synthesize, and easy to obtain. This improves the versatility of the present method.

In the forming a ruthenium-containing film, it is preferable that the first reducing gas be regulated in an atmosphere of $10^2$ Pa to $10^5$ Pa.

In the forming a ruthenium-containing film, it is preferable that the subject be regulated to a temperature of 150° C. to 500° C.

The adjustment of the temperature of the subject in the above range obtains the reducing effect of the reducing gas with a high repeatability, decreases the resistance of the copper wire, and allows for the copper-containing film to have superior burying characteristics. Further, when the temperature of the subject is 150° C. or greater, the growth reaction of the ruthenium-containing film may be enhanced. Further, when the temperature of the subject is 500° C. or less, excessive decomposition reactions of organic components and thermal damage of an underlayer material may be avoided.

In one example, the organic ruthenium complex is bis(2-methoxy-6-methyl-3,5-heptanedionato)-1,5-hexadiene ruthenium complex.

In one example, the organic copper complex is bis(2,6-dimethyl-2-(trimethylsilyloxy)-3,5-heptanedionato) copper complex.

In the burying the copper-containing film, it is preferred that the subject be regulated to a temperature of 150° C. to 350° C.

Regulation of the subject in the above temperature range obtains the reducing effect of the second reducing gas with a high repeatability, decreases the resistance of the copper wire, and allows for the copper-containing film to have superior burying characteristics. Further, when the temperature of the subject is 150° C. or greater, the growth reaction of the copper-containing film may be enhanced. Further, when the temperature of the subject is 350° C. or less, excessive decomposition reactions of organic components and thermal damage of an underlayer material may be avoided.

In one example, the second reducing gas used in the burying the copper-containing film is a gas containing hydrogen atoms.

It is preferred that the second reducing gas used in the burying the copper-containing film be hydrogen ($H_2$). When the ruthenium-containing film is formed by a microparticulate film, the resistance of the copper wire including the ruthenium-containing film and the copper-containing film may be decreased due to a large surface area of the microparticulate film.

BEST MODE FOR CARRYING OUT THE INVENTION

A method for manufacturing a semiconductor device according to one embodiment of the present invention will now be discussed with reference to the drawings. An apparatus for manufacturing a semiconductor device that carries out the method for manufacturing a semiconductor device according to one embodiment of the present invention will first be discussed.

Figure 1:
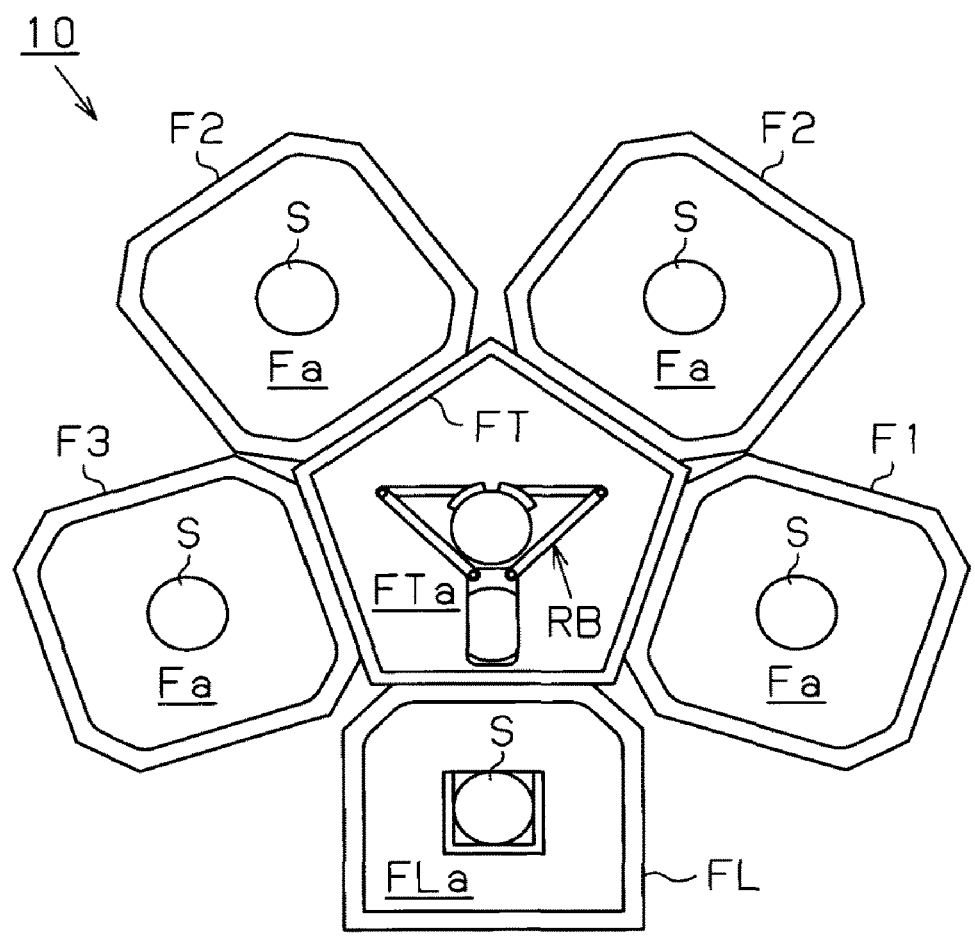
FIG. 1 is a schematic plan view showing an apparatus for manufacturing a semiconductor device according to the present invention.

FIG. 1 is a schematic plan view showing a manufacturing apparatus 10 for semiconductor devices. As shown in FIG. 1, the manufacturing apparatus 10 includes a load lock chamber FL (hereinafter referred to as the LL chamber FL), a transfer chamber FT, which is hermetically connected to the LL chamber FL, and an Ru chamber F1, preprocessing chamber F2, and Cu chamber F3, which are each hermetically and separably connected to the transfer chamber Ft.

The LL chamber FL has an interior that can be depressurized (hereinafter referred to as the retaining compartment FLa). A plurality of substrates S are loaded into the retaining compartment FLa and unloaded out of the retaining compartment FLa. When a film formation process of the substrates S starts, the LL chamber FL depressurizes the retaining compartment FLa and loads the substrates S into the transfer chamber FT. When the film formation process of the substrates S is completed, the retaining compartment FLa opens to the atmosphere and the substrates S are unloaded out of the manufacturing apparatus 10. For example, silicon substrates or glass substrates may be used as the substrates S. The substrates S are one example of a subject.

The transfer chamber FT has an interior that can be depressurized (hereinafter referred to as the transfer compartment FTa) and allows for the formation of a vacuum system, which is in communication with and commonly shared by all or some of the LL chamber FL, the Ru chamber F1, the preprocessing chamber F2, and the Cu chamber F3. The transfer chamber FTa houses a transfer robot RB, which transfers the substrates S. When a film formation process of the substrates S starts, based on transfer route information, the transfer robot RB transfers the substrates S to the Ru chamber F1, then the preprocessing chamber F2, and subsequently the Cu chamber F3, and afterwards unloads the substrates S into the LL chamber FL. Alternatively, based on transfer route information, the transfer robot RB transfers the substrates S to the Ru chamber F1, then to the preprocessing chamber F2, and afterwards unloads the substrates S into the LL chamber FL.

Figure 2:
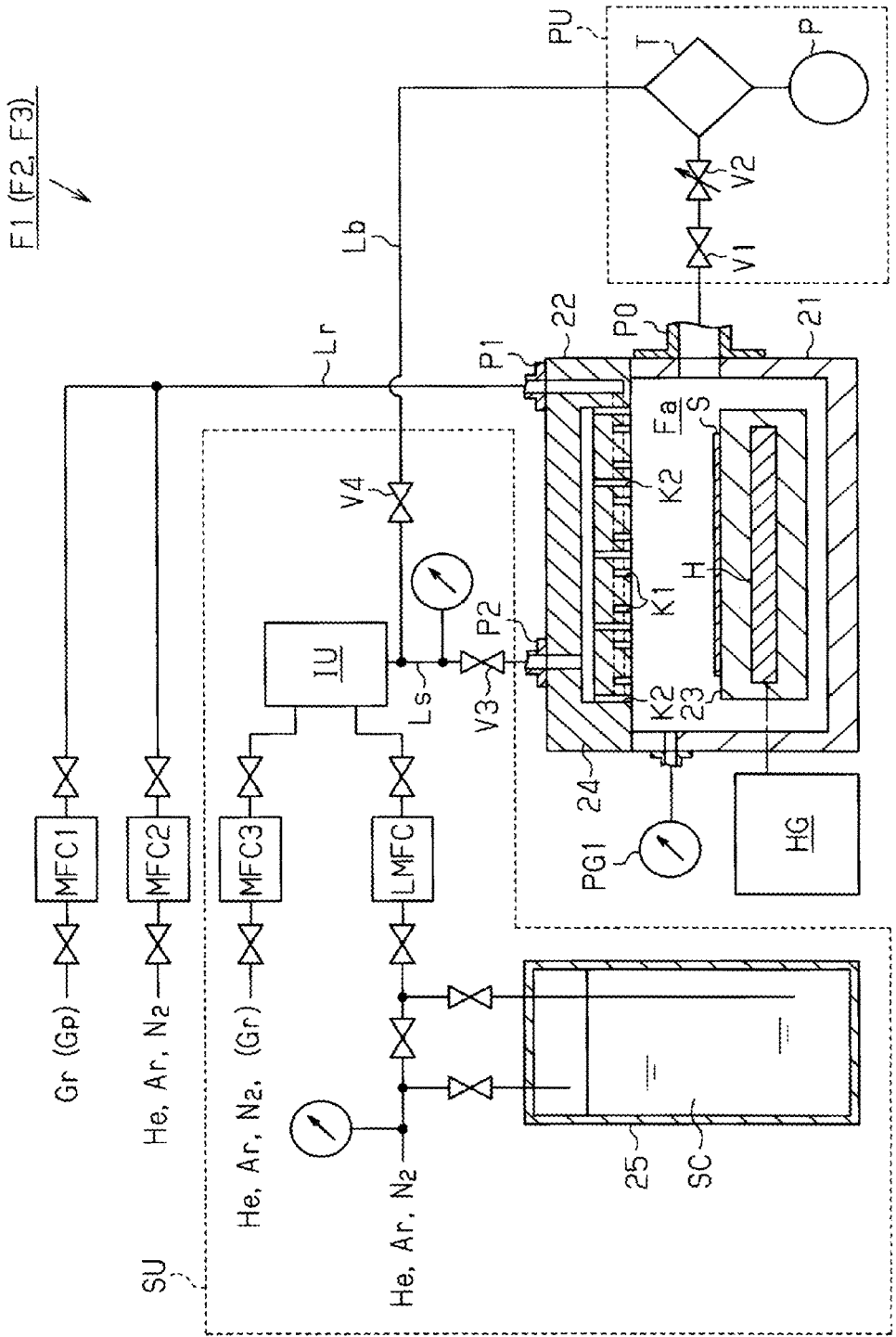
FIG. 2 is a schematic cross-sectional view showing the structure of an Ru chamber shown in FIG. 1.

The Ru chamber F1, the preprocessing chamber F2, and the Cu chamber F3 will now be discussed. FIG. 2 is a schematic cross-sectional side view showing the structure of the Ru chamber F1. The preprocessing chamber F2 and the Cu chamber F3 differ from the Ru chamber F1 only in that a raw material feeding unit SU is changed. Thus, only the differences will be discussed for the preprocessing chamber F2 and the Cu chamber F3.

The Ru chamber F1 is a chamber having a film formation space for forming a ruthenium-containing film (hereinafter referred to as the Ru film), which contains ruthenium, through a CVD process. The Cu chamber F3 is a chamber for forming a copper-containing film (hereinafter referred to as the Cu film, which contains copper, through a CVD process. The preprocessing chamber F2 is a chamber for conducting predetermined preprocessing on the Ru film before superimposing a Cu film on the Ru film. The predetermined preprocessing includes, for example, a process for decreasing the resistance of the Ru film or a process for improving the adhesion of the Ru film and the Cu film.

Referring to FIG. 2, the Ru chamber F1 includes a cylindrical chamber body 21, which is connected to the transfer chamber FT and has an upper opening, and a chamber lid 22, which is arranged above the chamber body 21 and closable to close the opening of the chamber body 21. When the chamber lid 22 closes the upper opening of the chamber body 21, a space (hereinafter referred to as a processing area Fa, which is a film formation space) is formed encompassed by the chamber body 21 and the chamber lid 22.

The processing area Fa retains a substrate S loaded from the transfer chamber FT. The substrate S is placed on a stage 23 in the processing area Fa. The stage 23 includes a heater H, which is connected to a heater power supply HG. When the heater H is driven, the substrate S on the stage 23 is heated to a predetermined temperature (e.g., 150° C. to 500° C.).

The processing area Fa is connected to an exhaust unit PU via an exhaust port PO and also connected to a pressure sensor PG1, which detects the pressure of the processing area Fa and outputs the detection result. The exhaust unit PU includes an exhaust valve V1, a pressure regulation valve V2, a raw material trap T, and an exhaust device P, such as turbo molecular pump and a dry pump. The pressure regulation valve V2 is driven in accordance with the detection result of the pressure sensor PG1 to regulate the pressure of the processing area Fa to a predetermined pressure (e.g., $10^2$ Pa to $10^5$ Pa). Further, each part of the exhaust unit PU excluding the raw material trap T is regulated to a predetermined temperature (20° C. to 250° C.) to avoid liquefaction of the raw material exhausted from the processing area Fa and maintain the exhausting capacity.

A shower head 24 for delivering gas into the processing area Fa is arranged at the upper side of the processing area Fa. The shower head 24 is regulated to a predetermined temperature (20° C. to 250° C.) to avoid liquefaction of a raw material SC and smoothly deliver the raw material SC into the processing area Fa. The shower head 24 includes a plurality of first supply holes K1 and a plurality of second supply holes K2, which are independent from the first supply holes K1. The first supply holes K1 are commonly connected to a first port P1, which is arranged in an upper portion of the chamber lid 22. Further, the second supply holes K2 are commonly connected to a second port P2, which is arranged in the upper portion of the chamber lid 22. A gas passage extending between the first port P1 and the first supply holes K1 is isolated from a gas passage extending between the second port P2 and the second supply holes K2. This prevents the gases flowing through the two gas passages from mixing in the shower head 24.

The first port P1 is connected by a reducing gas line Lr to a mass flow controller MFC1 for a reducing gas Gr and a mass flow controller MFC2 for a carrier gas (e.g., helium (He), argon (Ar), and nitrogen ($N_2$)). When the mass flow controller MFC2 delivers a predetermined amount of the carrier gas, the shower head 24 uniformly supplies the carrier gas through the first supply holes K1 to substantially the entire surface of the substrate S. In such a state, when the first port P1 is supplied with a predetermined amount of reducing gas Gr from the mass flow controller MFC1, the reducing gas Gr is carried by the carrier gas and supplied to substantially the entire surface of the substrate S through the first supply holes K1.

A gas that dissociates to release hydrogen radicals or hydrogen ions may be used as the reducing gas Gr. Further, the reducing gas Gr may be at least one selected from a group consisting of hydrogen ($H_2$), ammonia ($NH_3$), hydrazine derivative, silane ($SiH_4$), and disilane ($Si_2H_6$). Further, as the hydrazine derivative, substituted hydrazine in which one or two hydrogen atoms of hydrazine is substituted with a group selected from a group consisting of a methyl group, an ethyl group, and a normal or branched butyl group may be used. If the reducing gas Gr flows at a sufficient rate and is thereby stably supplied, the carrier gas may be eliminated and the mass flow controller MFC2 may be eliminated.

The second port P2 is connected by the reducing gas line Ls to the raw material supply unit SU, which forms a supply unit. The raw material supply unit SU includes a raw material tank 25, which stores raw material Sc for the Ru film, a liquid mass flow controller LMFC, which is connected to the raw material tank 25, and a gasifying unit IU, which is connected to the liquid mass flow controller LMFC. The raw material supply unit SU and the raw material gas line Ls are regulated to a predetermined temperature (20° C. to 250° C.) to avoid liquefaction of the raw material SC and smoothly supply the raw material SC.

As the raw material, bis(2-methoxy-6-methyl-3,5-heptanedionato)-1,5-hexadiene ruthenium complex may be used. Further, as the raw material SC, a solution in which the above ruthenium complex is dissolved in various types of solvents (e.g., hexane, octane, toluene, cyclohexane, methylcyclohexane, ethylcyclohexane, tetrahydrofuran and the like) may be used.

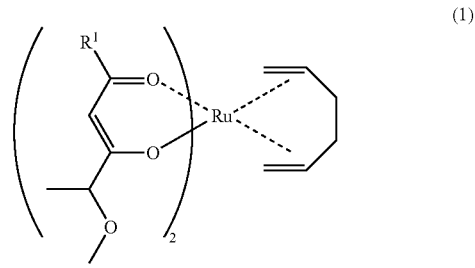

(1)

The raw material tank 25 is pressurized by a delivery gas (e.g., He, Ar, and $N_2$) so that the stored raw material SC is sent out at a predetermined pressure. The liquid mass flow controller LMFC regulates the raw material SC sent out of the raw material tank 25 to a predetermined supply amount and delivers the raw material SC to the gasifying unit IU. The gasifying unit IU is connected to a mass flow controller MFC3 for a carrier gas (e.g., He, Ar, and $N_2$). The gasifying unit IU gasifies the raw material SC from the liquid mass flow controller LMFC and delivers the raw material SC together with the carrier gas to the second port P2. The gasified raw material SC and the carrier gas are supplied through the second supply holes K2 to substantially the entire surface of the substrate S.

In this manner, in the Ru chamber F1, the processing area Fa is supplied with the reducing gas Gr and the raw material SC through independent gas passages, and the reducing gas Gr and the raw material SC are mixed only in the processing area Fa. As a result, even when the raw material SC is highly reactive to the reducing gas Gr, the reaction of the raw material SC occurs only in the processing area Fa.

A bypass line Lb, which extends to the raw material trap T, is connected to the raw material gas line Ls. When supplying the raw material SC to the processing area Fa, until the supply amount of the raw material SC stabilizes, the raw material supply unit SU closes a supply valve V3 and opens a switch valve V4 to deliver the raw material SU and carrier gas through the bypass line Lb to the raw material trap T. When the supply amount of the raw material SC stabilizes, the raw material supply unit SU closes the switch valve V4 and opens the supply valve V3 to supply the raw material SC and carrier gas to the processing area Fa. This increases the response for starting and stopping the supply of the raw material SC to the processing area Fa. The amount of the raw material SC increases readily when the supplying starts, and the amount of the raw material SC decreases readily when the supplying stops.

When the substrate S is loaded into the Ru chamber F1, the reducing gas Gr is supplied to the processing area Fa through the reducing gas line Lr, and the exhaust unit PU regulates the pressure of the processing area Fa to a predetermined pressure. For example, an atmosphere in which the reducing gas Gr is $10^2$ Pa or greater and $10^5$ Pa or less is formed in the Ru chamber F1. An atmosphere in which the reducing gas Gr is $10^2$ Pa or greater is preferable for sufficiently obtaining the reducing effect of the reducing gas Gr. An atmosphere in which the reducing gas Gr is $10^5$ Pa or less is preferable for avoiding excessive load on the exhaust unit PU.

The substrate S loaded into the Ru chamber F1 is placed on the stage 23, and the heater H heats the substrate S to a predetermined temperature. The temperature of the substrate S is regulated to, for example, 150° C. or greater and 500° C. or less. A temperature that is 150° C. or greater is preferable for starting the thermolytic reaction of the raw material SC. A temperature that is 500° C. or less is preferable for avoiding thermal damage of a lower layer conductor such as a lower layer wire.

An atmosphere of the reducing gas Gr is formed in the Ru chamber F1. When the substrate S is heated to the predetermined temperature in the Ru chamber F1, the processing area Fa is supplied with a predetermined amount of the raw material SC through the raw material gas line Ls, the raw material SC undergoes thermolysis in the atmosphere of the reducing gas Gr, and the Ru film is deposited on the substrate S.

As a result, the Ru chamber F1 reduces oxides of the lower layer conductor and oxides of the Ru film with the reducing gas Gr so that they approach a metal state. The Ru chamber F1 prevents the formation of an oxide film between the lower layer conductor and the Ru film and connects the lower layer conductor and the Ru film with a low contact resistance.

The preprocessing chamber F2 has substantially the same structure as the Ru chamber F1 but differs from the Ru chamber F1 in that it does not include the raw material supply unit SU and in that the mass flow controller MFC1 supplies preprocessing gas Gp, which is used for preprocessing. The preprocessing gas Gp may be, for example, an inert gas (e.g., He, Ar, and $N_2$) if the preprocessing chamber F2 performs heat treatment in an inert gas atmosphere. Further, the preprocessing gas Gp may be, for example, a reducing gas when heat treatment is performed in a reducing gas atmosphere.

When the substrate S is loaded into the preprocessing chamber F2, the preprocessing gas Gp is supplied to the processing area Fa of the preprocessing chamber F2 through the reducing gas line Lr, and the exhaust unit PU is driven to regulate the pressure of the processing area Fa to a predetermined pressure. For example, the preprocessing chamber F2 ensures that oxides of the Ru film are reduced in an atmosphere in which the reducing gas Gr is $10^2$ Pa or greater and avoids excessive load on the exhaust unit PU in an atmosphere in which the reducing gas Gr is $10^5$ Pa or less.

The substrate S loaded into the preprocessing chamber F2 is placed on the stage 23, and the heater H regulates the substrate S at a predetermined temperature. The temperature of the substrate S is regulated to, for example, 150° C. or greater to effectively discharge residual organic components from the Ru film. Further, the preprocessing chamber F2 regulates the substrate S to 500° C. or less to avoid thermal damage of a lower layer conductor.

In this manner, the preprocessing chamber F2 performs predetermined preprocessing on the Ru film deposited on the substrate S to lower the resistance of the Ru film.

The Cu chamber F3 has substantially the same structure as the Ru chamber F1 but differs from the Ru chamber F1 in that the raw material SC is an organic copper complex. Otherwise, the structure is the same as the Ru chamber F1.

As the organic copper complex, bis(2,6-dimethyl-2-(trimethylsilyloxy)-3,5-heptanedionato) copper complex may be used. Further, as the raw material SC, a solution in which the copper complex is dissolved in various types of solvents (e.g., hexane, octane, toluene, cyclohexane, methylcyclohexane, ethylcyclohexane, tetrahydrofuran and the like) may be used.

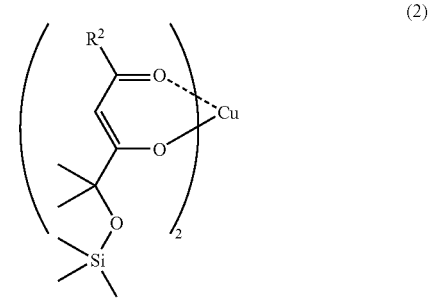

(2)

When the substrate S is loaded into the Cu chamber F3, the reducing gas Gr is supplied to the processing area Fa in the Cu chamber F3 through the reducing gas line Lr, and the exhaust unit PU regulates the pressure of the processing area Fa to a predetermined pressure. For example, an atmosphere in which the reducing gas Gr is $10^2$ Pa or greater sufficiently obtains the reducing effect of the reducing gas Gr. An atmosphere in which the reducing gas Gr is $10^5$ Pa or less avoids excessive load on the exhaust unit PU.

The substrate S loaded into the Cu chamber F2 is placed on the stage 23, and the heater H heats the substrate S to a predetermined temperature. For example, the Cu chamber F3 starts the thermolytic reaction of the raw material SC when the temperature reaches 150° C. or greater and avoids thermal damage of a lower layer wire, an Ru film, and a Cu film by regulating the temperature to 350° C. or less.

An atmosphere of the reducing gas Gr is formed in the Cu chamber F3. When the substrate S is heated to the predetermined temperature, the processing area Fa in the Cu chamber F3 is supplied with a predetermined amount of the raw material SC through the raw material gas line Ls, the raw material SC undergoes thermolysis under the atmosphere of the reducing gas Gr, and the Cu film is deposited on the Ru film.

As a result, the Cu chamber F3 reduces oxides of the Ru film with the reducing gas Gr so that they approach a metal state. The Cu chamber F3 prevents the formation of an oxide film between the Ru film and the Cu film and connects the Ru film and the Cu film with a low contact resistance. Further, when forming the Ru film as a microparticulate film as described above, in comparison with when the Ru film has a smooth surface, the surface area of the Ru film may be drastically increased. Thus, the incubation time of the Cu film may be drastically shortened, and the time required to form the Cu film may be shortened while decreasing the contact resistance between the Ru film and the Cu film.

Figure 3:
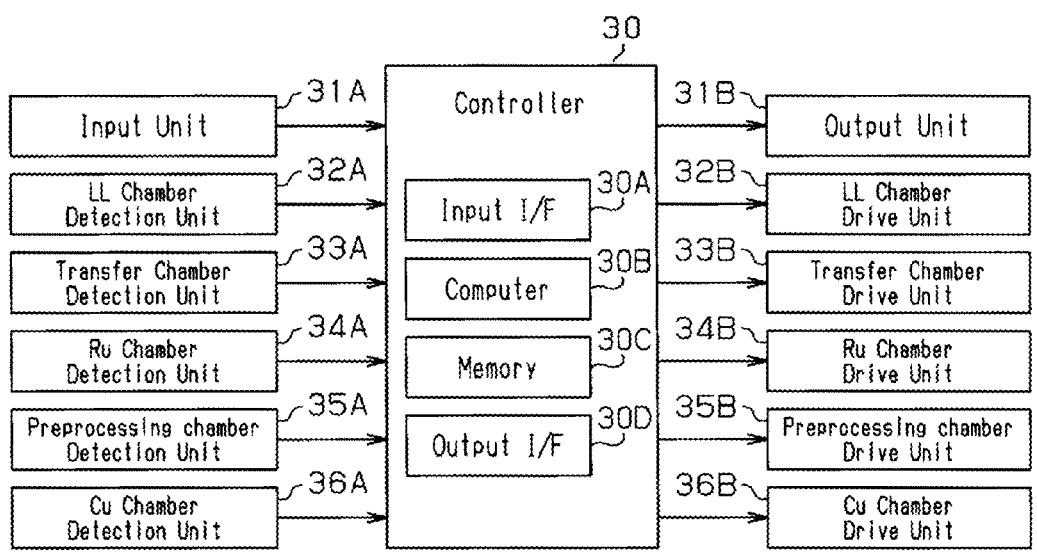
FIG. 3 is a block circuit diagram of the manufacturing apparatus shown in FIG. 1.

The electric structure of the semiconductor device manufacturing apparatus 10 will now be discussed. FIG. 3 is an electric block circuit diagram showing the electric structure of the manufacturing apparatus 10.

Referring to FIG. 3, a controller 30 controls various processes of the semiconductor device manufacturing apparatus 10, such as, the transfer process of the substrates S, the film formation process of the Ru film, the preprocessing, and the film formation process of the Cu film. The controller 30 includes an input I/F 30A, which receives various types of signals, a computer 30B, which performs various computations, a memory 30C, which stores various types of data and various types of programs, and an output I/F 30D, which outputs various types of signals.

The controller 30 is connected via the input I/F 30A to an input unit 31A, an LL chamber detection unit 32A, a transfer chamber detection unit 33A, an Ru chamber detection unit 34A, a preprocessing chamber detection unit 35A, and a Cu chamber detection unit 36A.

The input unit 31A includes various types of switches, such as an activation switch and a stop switch, and provides the controller 30 with various types of processing data used by the manufacturing apparatus 10. For example, the input unit 31A provides the controller 30 with information on the transfer process of the substrates S, information on the film formation process of the Ru film, information on the preprocessing, and information on the film formation process of the Cu film.

Thus, the input unit 31A provides the controller 30 with information on the transfer route (processing order of the various processes) of the substrate S. Further, the input unit 31A provides the controller 30 with film formation conditions for performing the film formation process of the Ru film (e.g., substrate temperature, flow rate of the reducing gas Gr, supply amount of the raw material SC, film formation pressure, and film formation time). The input unit 31A also provides the controller 30 with film formation conditions for performing the film formation process of the Cu film (e.g., substrate temperature, flow rate of the reducing gas Gr, supply amount of the raw material SC, film formation pressure, and film formation time).

The controller 30 stores the various types of processing data input from the input unit 31A and controls processes under the conditions of the corresponding processing data.

The LL chamber detection unit 32A detects the state of the LL chamber FL, for example, the actual pressure of the retaining compartment FLa and the number of substrates S, and provides the detection result to the controller 30. The transfer chamber detection unit 33A detects the state of the transfer chamber FT, for example, the arm position of the transfer robot RB, and provides the detection result to the controller 30.

The Ru chamber detection unit 34A detects the state of the Ru chamber F1, for example, the actual temperature of the corresponding substrate S, the actual pressure of the processing area Fa, the actual flow rate of the reducing gas Gr, the actual supply amount of the raw material SC, and the actual processing time, and provides the detection result to the controller 30.

The preprocessing chamber detection unit 35A detects the state of the preprocessing chamber F2, for example, the actual temperature of the corresponding substrate S, the actual pressure of the processing area Fa, the actual flow rate of the preprocessing gas Gp, and the actual processing time, and provides its detection result to the controller 30.

The Cu chamber detection unit 36A detects the state of the Cu chamber F3, for example, the actual temperature of the corresponding substrate S, the actual pressure of the processing area Fa, the actual flow rate of the reducing gas Gr, the actual supply amount of the raw material SC, and the actual processing time, and provides the detection result to the controller 30.

The controller 30 is connected via the output I/F 30D to an output unit 31B, an LL chamber drive unit 32B, a transfer chamber drive unit 33B, an Ru chamber drive unit 34B, a preprocessing chamber drive unit 35B, and a Cu chamber drive unit 36B.

The output unit 31B includes various types of display units such as a liquid crystal display and outputs processing status data.

The controller 30 uses the detection result from the LL chamber detection unit 32A to provide the LL chamber drive unit 32B with a drive control signal corresponding to the LL chamber drive unit 32B. In response to the drive control signal from the controller 30, the LL chamber drive unit 32B depressurizes or opens to the atmosphere the retaining compartment FLa to allow for the substrate S to be loaded or unloaded.

The controller 30 uses the detection result from the transfer chamber detection unit 33A to provide the transfer chamber drive unit 33B with a drive control signal corresponding to the transfer chamber detection unit 33A. In response to the drive control signal from the controller 30, the transfer chamber drive unit 33B transfers the substrate S in accordance with processing order information in the order of the LL chamber FL, the transfer chamber FT, the Ru chamber F1, the preprocessing chamber F2, and the Cu chamber F3.

The controller 30 uses the detection result from the Ru chamber detection unit 34A to provide the Ru chamber drive unit 34B with a drive control signal corresponding to the Ru chamber drive unit 34B. In response to the drive control signal from the controller 30, the Ru chamber drive unit 34B performs a film formation process of the Ru film under the film formation conditions from the input unit 31A.

The controller 30 uses the detection result from the preprocessing chamber detection unit 35A to provide the preprocessing chamber drive unit 35B with a drive control signal corresponding to the preprocessing chamber drive unit 35B. In response to the drive control signal from the controller 30, the preprocessing chamber drive unit 35B performs predetermined preprocessing under the preprocessing conditions from the input unit 31A.

The controller 30 uses the detection result from the Cu chamber detection unit 36A to provide the Cu chamber drive unit 36B with a drive control signal corresponding to the Cu chamber drive unit 36B. In response to the drive control signal from the controller 30, the Cu chamber drive unit 36B performs a film formation process of the Cu film under the film formation conditions for the Cu film from the input unit 31A.

Figure 4:
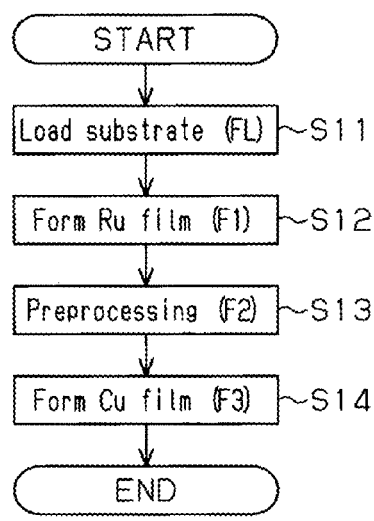
FIG. 4 is a flowchart showing copper wire formation procedures carried out by the manufacturing apparatus shown in FIG. 1.

A method for manufacturing a semiconductor device will now be discussed. FIG. 4 is a flowchart showing the semiconductor device manufacturing method.

First, in response to an operation signal for forming a copper wire, the controller 30 reads a copper wire formation process program from the memory 30C. Next, when the substrate S is loaded into the LL chamber FL, the controller 30 receives various types of data from the input unit 31A (step S11). Then, the controller 30 detects the state of the LL chamber FL and the state of the transfer chamber FT and starts the transfer process of the substrate S in accordance with the processing order information input from the input unit 31A.

More specifically, the controller 30 transfers the substrate S from the LL chamber FL to the Ru chamber F1 and forms an atmosphere of the reducing gas Gr in the processing area Fa of the Ru chamber F1 based on the film formation conditions of the Ru film from the input unit 31A. Further, the controller 30 drives the heater H of the Ru chamber F1 to increase the temperature of the substrate S and then supplies the corresponding raw material SC and performs the film formation process of the Ru film (step S12). Then, the controller 30 detects the state of the Ru chamber F1 and determines whether or not the film formation process of the Ru film has been completed. When the film formation process of the Ru film has been completed, the controller 30 transfers the substrate S from the Ru chamber F1 to the preprocessing chamber F2.

When the substrate S is transferred to the preprocessing chamber F2, the controller 30 forms an atmosphere of the preprocessing gas Gp in the processing area Fa of the preprocessing chamber F2 based on the preprocessing conditions from the input unit 31A. Further, the controller 30 drives the heater H of the preprocessing chamber F2 to increase the temperature of the substrate S and then performs preprocessing corresponding to the Ru film and the Cu film (step S13). Then, the controller 30 detects the state of the preprocessing chamber F2 and determines whether or not the preprocessing has been completed. When the preprocessing is completed, the controller 30 transfers the substrate S to the Cu chamber F3.

When the substrate S is transferred to the Cu chamber F3, the controller 30 forms an atmosphere of the reducing gas Gr in the processing area Fa of the Cu chamber F3 based on the film formation conditions of the Cu film from the input unit 31A. Further, the controller 30 drives the heater H of the Cu chamber F3 to increase the temperature of the substrate S and then supplies the corresponding raw material SC and performs the film formation process of the Cu film (step S14). Then, the controller 30 detects the state of the Cu chamber F3 and determines whether or not the film formation process of the Cu film has been completed. When the film formation process has been completed, the controller 30 transfers the substrate S from the Cu chamber F3 to the LL chamber FL.

Afterward, in the same manner, for every one of the substrates S, the controller 30 sequentially performs the film formation process of the Ru film, the preprocessing, and the film formation process of the Cu film to form a Cu wire. Then, the controller 30 detects the state of the LL chamber FL. When the copper wire is formed on every one of the substrates, the controller 30 opens the LL chamber FL to the atmosphere and unloads the substrates S out of the LL chamber FL.

EXAMPLE

Figure 5:
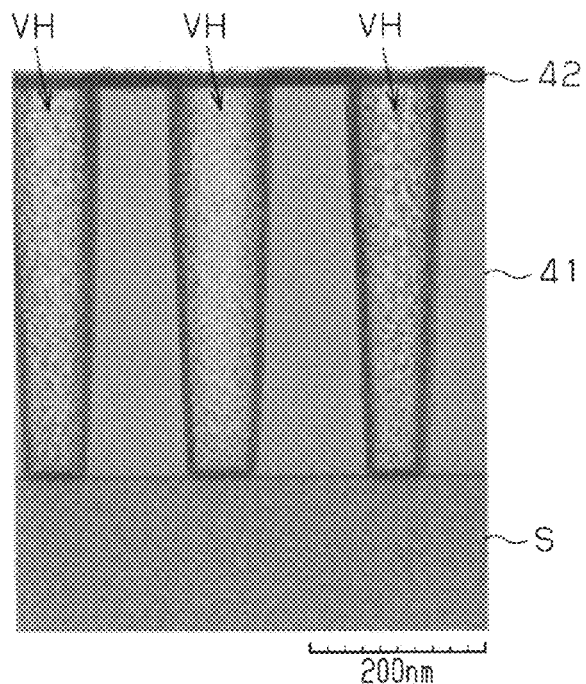
FIG. 5 is a TEM cross-sectional view of an Ru film formed in an example.

The burying characteristics of the copper wire formed with the semiconductor device manufacturing apparatus will now be discussed. FIGS. 4 and 5 are TEM (Transmission Electron Microscope) cross-sectional images respectively showing the burying characteristics of the Ru film formed by the semiconductor device manufacturing apparatus 10 and the burying characteristics of the Cu film formed on the Ru film.

First, using a silicon substrate as the substrate S, an insulative layer 41 having a thickness of 480 nm was formed on the substrate S, and a hole VH (recess) was formed in the insulative layer 41 with a hole diameter of 80 nm and an aspect ratio (hole depth/hole diameter) of 5.8. Then, an Ru film 42 was formed on the surface of the insulative layer 41 under the film formation conditions for the Ru film shown below, and a TEM cross-sectional image was taken. Further, preprocessing was performed on the Ru film 42 under the preprocessing conditions shown below. Then, a Cu film 43 was formed on the surface of the Ru film 42 under the film formation conditions for the Cu film shown below, and a TEM cross-sectional image was taken.

[Film Formation Conditions for Ru Film]
Raw material SC: 0.5 mol/L of bis(2-methoxy-6-methyl-3,5-heptanedionato)-1,5-hexadiene ruthenium complex in n-octane solvent Supply amount of raw material SC: 0.1 g/min
Reducing gas Gr: hydrogen
Flow rate of reducing gas Gr: 3 L/min
Substrate temperature: 450° C.
Film formation pressure: 750 Pa
Film formation time: 720 seconds
[Preprocessing Conditions]
Substrate temperature: 350° C.
Process gas: hydrogen
Processing pressure: 3500 Pa
[Film Formation Conditions for Cu Film]
Raw material SC: 0.5 mol/L of bis(2,6-dimethyl-2-(trimethylsilyloxy)-3,5-heptanedionato) copper complex in n-octane solvent
Supply amount of raw material SC: 0.2 g/min
Reducing gas Gr: hydrogen
Flow rate of reducing gas Gr: 3 L/min
Substrate temperature: 270° C.
Film formation pressure: 2500 Pa
Film formation time: 720 seconds In FIG. 5, as shown by the dark regions, it is apparent that the Ru film 42 is formed uniformly with a film thickness of about 20 nm on the upper surface of the insulative layer 41 and on the entire inner wall of the holes VH. In this manner, in the film formation process of the Ru film, that is, the film formation process that performs thermolysis on the organic ruthenium complex under a reducing atmosphere, the Ru film 42 is obtained with a high film thickness uniformity and high step coverage even when the underlayer is the insulative layer 41.

Figure 6:
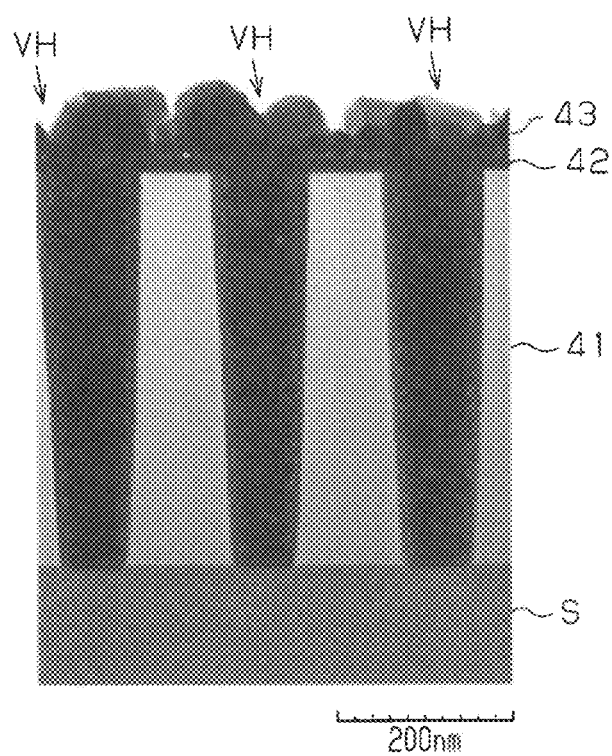
FIG. 6 is a TEM cross-sectional view showing a Cu film formed in an example.

In FIG. 6, as shown by the dark regions, it is apparent that the Cu material of the Cu film 43 is uniformly filled into the entire interior of the holes VH. In this manner, the film formation process of the Ru film, the preprocessing, and the film formation process of the Cu film forms a Cu wire having superior burying characteristics. Then, the successive processes performed under a reducing atmosphere reduces oxides in an underlayer wire, oxides in the Ru film, and oxides in the Cu film and thereby decreases the resistance of the copper wire.

[Semiconductor Device]

Figure 7:
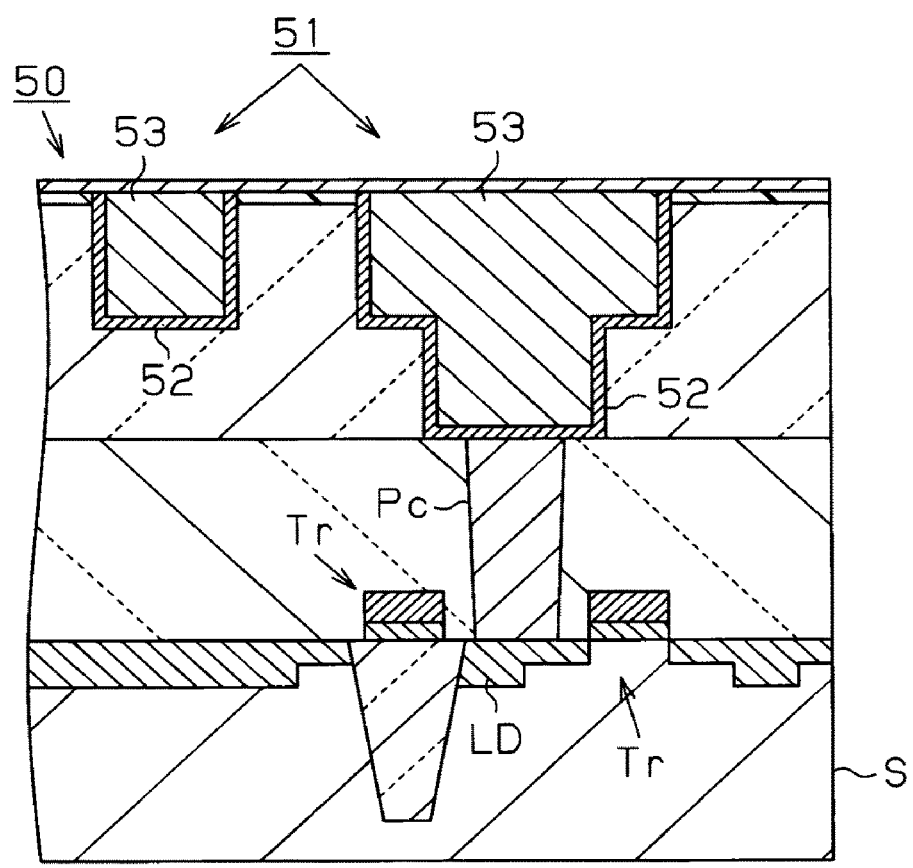
FIG. 7 is a cross-sectional view of a semiconductor device manufactured through a method for manufacturing a semiconductor device according to the present invention.

A semiconductor device manufactured by the manufacturing method described above will now be discussed. FIG. 7 is a cross-sectional diagram showing a semiconductor device.

Referring to FIG. 7, a semiconductor device 50 is, for example, a memory device or MPU, which includes various types of RAMs and various types of ROMs, or a logic device, which includes a versatile logic. A thin film transistor Tr is formed on the substrate S of the semiconductor device 50, and a copper wire 51 is connected via a contact plug Pc to a diffusion layer LD of the thin film transistor Tr.

The copper wire 51 includes an underlayer 52, which is connected to the contact plug Pc, and a wiring layer 53, which fills the interior of holes covered by the underlayer 52. The underlayer 52 is a layer including an Ru film and formed by the Ru film formation process, which uses the Ru chamber F1, and the preprocessing, which uses the preprocessing chamber F2. The wiring layer 53 is formed by the Cu film formation process, which uses the Cu chamber F3. As a result, the wiring layer 53 decreases the contact resistance between the contact plug Pc and the underlayer 52 and the contact resistance between the underlayer 52 and the wiring layer 53, and improves reliability.

The embodiment described above has the advantages described below.

(1) In the embodiment described above, the CVD process using the raw material SC, which includes the organic ruthenium complex, and the reducing gas (first reducing gas) Gr forms the Ru film on the substrate in which recesses are formed (step S12). Then, the CVD process using the raw material SC, which includes the organic ruthenium complex, and the reducing gas Gr forms the Cu film on the Ru film and buries the recesses with the Cu film (step S14).

Accordingly, the Ru film and the Cu film are each formed in a reduction gas atmosphere. As a result, during formation of the Ru film and the Cu film, the oxides of an underlayer wire and the oxides of a copper wire are reduced and approach a metal state. This decreases the resistance of the copper wire.

(2) In the Ru film formation process (step S12) and the Cu film formation process (step S14) of the above-described embodiment, the reducing gas Gr is a gas that dissociates and releases hydrogen radicals and hydrogen ions. Alternatively, the reducing gas Gr is at least one selected from a group consisting of hydrogen ($H_2$), ammonia ($NH_3$), hydrazine derivative, silane ($SiH_4$), and disilane ($Si_2H_6$). Accordingly, the manufacturing method of the semiconductor device has a higher versatility.

(3) In the Ru film formation process (step S12) of the embodiment described above, the pressure of the reducing gas Gr is regulated to 102 Pa to 105 Pa, and the temperature of the substrate S is adjusted to 150° C. to 500° C. Accordingly, the growing speed of the Ru film and the reducing effect of the reducing gas Gr are obtained with high repeatability, and thermal damage of the underlayer is avoided. This forms a copper wire having the desired electrical characteristics with high repeatability.

(4) In the embodiment described above, the substrate S subsequent to the Ru film formation step is placed in an atmosphere of the preprocessing gas Gp, and the preprocessing is performed on the Ru film prior to the formation of the Cu film. Accordingly, the resistance of the Ru film may be decreased, and the adhesion of the Ru film and the Cu film may be improved. As a result, the reliability of the copper wire may be further improved.

The embodiment described above may be modified in the forms described below.

In the embodiment described above, the preprocessing (step S13) is performed after the Ru film formation process (step S12). However, the present invention is not limited in such a manner. For example, the Cu formation process may follow the Ru formation process (step S14).

In the embodiment described above, a heat treatment or a reducing process is performed during the preprocessing. However, the present invention is not limited in such a manner. For example, during the preprocessing, an oxidation process for eliminating organic components from the Ru film may first be performed, and a reducing process for reducing oxides of the Ru film to form metal Ru may then be performed. Alternatively, during the preprocessing, an adhesion layer may be formed on the Ru film to improve the adhesion between the Ru film and the Cu film. In other words, prior to the formation of the Cu film, the preprocessing may be performed to decrease the resistance of the Ru film or improve the adhesion between the Ru film and the Cu film.

In the embodiment described above, the semiconductor device manufacturing apparatus 10 houses the preprocessing chamber F2, which is for performing preprocessing on the Ru film, and includes the preprocessing chamber detection unit 35A and the preprocessing chamber drive unit 35B. However, the present invention is not limited in such a manner, and the preprocessing chamber F2, the preprocessing chamber detection unit 35A, and the preprocessing chamber drive unit 35B may be eliminated from the semiconductor device manufacturing apparatus 10. For example, the semiconductor device manufacturing apparatus 10 may use the Ru chamber F1 to perform predetermined preprocessing such as a heat treatment and a reducing process.

In the embodiment described above, the semiconductor device manufacturing apparatus 10 houses the preprocessing chamber F2, which is for performing preprocessing on the Ru film, and includes the preprocessing chamber detection unit 35A and the preprocessing chamber drive unit 35B. Further, the manufacturing apparatus 10 houses the Cu chamber F3, which is for forming a Cu film, and includes the Cu chamber detection unit 36A and the Cu chamber drive unit 36B. However, the present invention is not limited in such a manner, and the preprocessing chamber F2 and the Cu chamber F3 may be eliminated from the manufacturing apparatus 10. For example, the Ru chamber F1 may be used to switch gases so that the predetermined preprocessing, such as a heat treatment or a reducing process, and the Cu film formation process are all performed.

In the embodiment described above, the Ru chamber F1 and the Cu chamber F3 respectively deliver the raw material SC and the reducing gas Gr to the processing areas Fa through independent gas passages. However, the present invention is not limited in such a manner. For example, when the reactivity of raw material SC and the reducing gas Gr is low, the first port P1 and the second port P2 may be formed as a single common port. Further, the first supply holes K1 and the second supply holes K2 may be formed in communication with one another, and the reducing gas Gr may be the carrier gas of the mass flow controller MFC3. In other words, the supply passages of the raw material SC and the reducing gas Gr may be modified in various forms as long as the raw material SC undergoes thermolysis in the atmosphere of the reducing gas Gr.

In the embodiment described above, the raw material supply unit SU forces the raw material SC out of the raw material tank 25 with pressurized delivery gas, gasifies the raw material SC with the gasification unit IU, and supplies the gasified raw material SC to the processing area Fa. However, the present invention is not limited in such a manner. For example, the raw material supply unit SU may draw a carrier gas into the raw material SC in the raw material tank 25, and a gas mixture of the carrier gas and the raw material SC may be supplied to the processing area Fa so as to perform a bubbling process. In other words, the method for supplying the raw material SC may be modified in various forms as long as the raw material SC undergoes thermolysis under a reducing atmosphere in the processing area Fa.

The invention claimed is:

1. A method for manufacturing a semiconductor device including a copper wire, the method comprising:

forming a ruthenium-containing film on a subject in which a recess is formed by performing a CVD process using an organic ruthenium complex, which is expressed by general expression (1) (where in the expression, $R^1$ indicates a normal or branched alkyl group of which number of carbon atoms is 1 to 4), and a first reducing gas,

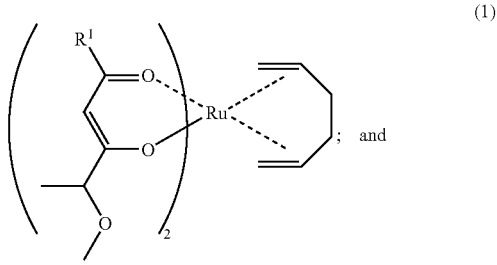

forming a copper-containing film on the ruthenium-containing film to bury copper-containing film in the recess by performing a CVD process using an organic copper complex, which is expressed by general expression (2) (where in the expression, R² indicates a normal or branched alkyl group of which number of carbon atoms is 1 to 4), and a second reducing gas

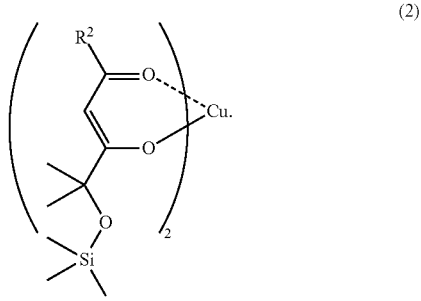

2. The method for manufacturing a semiconductor device according to claim 1, wherein the forming a ruthenium-containing film includes dissociating the first reducing gas to release hydrogen radicals and hydrogen ions.

3. The method for manufacturing a semiconductor device according to claim 1, wherein the first reducing gas used in the forming a ruthenium-containing film is at least one selected from a group consisting of hydrogen ($H_2$), ammonia ($NH_3$), hydrazine derivative, silane ($SiH_4$), and disilane ($Si_2H_6$).

4. The method for manufacturing a semiconductor device according to claim 3, wherein the hydrazine derivative used in the forming a ruthenium-containing film is substituted hydrazine that substitutes one or two hydrogen atoms of hydrazine with a group selected from a group consisting of a methyl group, an ethyl group, and a normal or branched butyl group.

5. The method for manufacturing a semiconductor device according to claim 1, wherein the forming a ruthenium-containing film includes regulating the first reducing gas in an atmosphere of $10^2$ Pa to $10^5$ Pa.

6. The method for manufacturing a semiconductor device according to claim 1, wherein the forming a ruthenium-containing film includes regulating the subject to a temperature of 150° C. to 500° C.

7. The method for manufacturing a semiconductor device according to claim 1, wherein the organic ruthenium complex is bis(2-methoxy-6-methyl-3,5-heptanedionato)-1,5-hexadiene ruthenium complex.

8. The method for manufacturing a semiconductor device according to claim 1, wherein the organic copper complex is bis(2,6-dimethyl-2-(trimethylsilyloxy)-3,5-heptanedionato) copper complex.

9. The method for manufacturing a semiconductor device according to claim 1, wherein the burying the copper-containing film includes regulating the subject to a temperature of 150° C. to 350° C.

10. The method for manufacturing a semiconductor device according to claim 1, wherein the second reducing gas used in the burying the copper-containing film is a gas containing hydrogen atoms.

11. The method for manufacturing a semiconductor device according to claim 1, wherein the second reducing gas used in the burying the copper-containing film is hydrogen ($H_2$).

12. The method for manufacturing a semiconductor device according to claim 1, wherein the ruthenium-containing film is a microparticulate film.

13. A method for manufacturing a semiconductor device, the method comprising:
forming a ruthenium-containing film on a subject in which a recess is formed by performing a CVD process using an organic ruthenium complex, which is expressed by general expression (1) (where in the expression, R¹ indicates a normal or branched alkyl group of which number of carbon atoms is 1 to 4), and a first reducing gas,

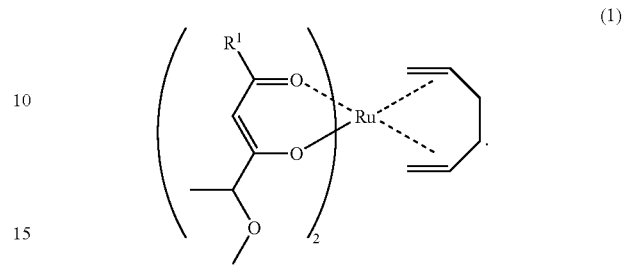

14. The method for manufacturing a semiconductor device according to claim 13, wherein the forming a ruthenium-containing film includes dissociating the first reducing gas to release hydrogen radicals and hydrogen ions.

15. The method for manufacturing a semiconductor device according to claim 13, wherein the first reducing gas used in the forming a ruthenium-containing film is at least one selected from a group consisting of hydrogen ($H_2$), ammonia ($NH_3$), hydrazine derivative, silane ($SiH_4$), and disilane ($Si_2H_6$).

16. The method for manufacturing a semiconductor device according to claim 15, wherein the hydrazine derivative used in the forming a ruthenium-containing film is substituted hydrazine that substitutes one or two hydrogen atoms of hydrazine with a group selected from a group consisting of a methyl group, an ethyl group, and a normal or branched butyl group.

17. The method for manufacturing a semiconductor device according to claim 13, wherein the forming a ruthenium-containing film includes regulating the first reducing gas in an atmosphere of $10^2$ Pa to $10^5$ Pa.

18. The method for manufacturing a semiconductor device according to claim 13, wherein the forming a ruthenium-containing film includes regulating the subject to a temperature of 150° C. to 500° C.

19. The method for manufacturing a semiconductor device according to claim 13, wherein the organic ruthenium complex is bis(2-methoxy-6-methyl-3,5-heptanedionato)-1,5-hexadiene ruthenium complex.

20. The method for manufacturing a semiconductor device according to claim 13, wherein the organic copper complex is bis(2,6-dimethyl-2-(trimethylsilyloxy)-3,5-heptanedionato) copper complex.

21. The method for manufacturing a semiconductor device according to claim 13, wherein the burying the copper-containing film includes regulating the subject to a temperature of 150° C. to 350° C.

22. The method for manufacturing a semiconductor device according to claim 13, wherein the second reducing gas used in the burying the copper-containing film is a gas containing hydrogen atoms.

23. The method for manufacturing a semiconductor device according to claim 13, wherein the second reducing gas used in the burying the copper-containing film is hydrogen ($H_2$).

24. The method for manufacturing a semiconductor device according to claim 13, wherein the ruthenium-containing film is a microparticulate film.

* * * * *